(12) United States Patent
Anders et al.

(10) Patent No.: US 9,806,540 B2
(45) Date of Patent: Oct. 31, 2017

(54) RECEIVING DEVICE FOR RECEIVING A MAGNETIC FIELD AND FOR PRODUCING ELECTRIC ENERGY BY MAGNETIC INDUCTION

(71) Applicant: Bombardier Transportation GmbH, Berlin (DE)

(72) Inventors: Dominik Anders, Mannheim (DE); Simon Wechsler, Mannheim (DE)

(73) Assignee: Bombardier Transportation GmbH, Berlin (DE)

( * ) Notice: Subject to any disclaimer, the term of this patent is extended or adjusted under 35 U.S.C. 154(b) by 210 days.

(21) Appl. No.: 14/782,901

(22) PCT Filed: Apr. 8, 2014

(86) PCT No.: PCT/EP2014/057087
§ 371 (c)(1),
(2) Date: Oct. 7, 2015

(87) PCT Pub. No.: WO2014/166963
PCT Pub. Date: Oct. 16, 2014

(65) Prior Publication Data
US 2016/0049797 A1      Feb. 18, 2016

(30) Foreign Application Priority Data

Apr. 9, 2013    (GB) .................................... 1306392.0

(51) Int. Cl.
*H02J 5/00*        (2016.01)
*H01F 38/14*    (2006.01)
(Continued)

(52) U.S. Cl.
CPC ............. *H02J 5/005* (2013.01); *B60L 11/182* (2013.01); *H01F 38/14* (2013.01); *H05K 13/00* (2013.01);
(Continued)

(58) Field of Classification Search
USPC ........................................................ 307/104
See application file for complete search history.

(56) References Cited

U.S. PATENT DOCUMENTS 4,118,704 A    10/1978    Ishino et al.
5,656,983 A *    8/1997    Ito ........................... H01F 38/14
335/297

(Continued)

FOREIGN PATENT DOCUMENTS

CN    1781168 A    5/2006
CN    1945971 A    4/2007
(Continued)

*Primary Examiner* — An Luu
(74) *Attorney, Agent, or Firm* — The Webb Law Firm (57) ABSTRACT

A receiving device for receiving a magnetic field and producing electric energy by magnetic induction. The receiving device includes at least one coil of an electric line. The magnetic field induces an electric voltage in the coil during operation. The coil has an inductance. The receiving device and the coil are adapted to receive the magnetic field from a receiving side. The receiving device includes a case enclosing the at least one coil and further components of the receiving device. The receiving device includes at least one capacitor. The capacitor is electrically connected to the coil or to at least one of the coils so as to form an electric circuit having a resonance frequency according to the inductance(s) of the coil(s) and to the capacitance(s) of the capacitor(s).

13 Claims, 9 Drawing Sheets

(51) Int. Cl.
   *B60L 11/18*     (2006.01)
   *H05K 13/00*     (2006.01)
(52) U.S. Cl.
   CPC ........ *Y02T 10/7005* (2013.01); *Y02T 10/7072* (2013.01); *Y02T 90/122* (2013.01); *Y02T 90/14* (2013.01)

(56) References Cited

U.S. PATENT DOCUMENTS

| | | | |
|---|---|---|---|
| 5,939,966 A | 8/1999 | Shin' Ei | |
| 6,351,202 B1 | 2/2002 | Ito et al. | |
| 7,969,045 B2 | 6/2011 | Schmidt et al. | |
| 8,193,886 B2 | 6/2012 | Hahn et al. | |
| 9,634,515 B2 * | 4/2017 | Hirobe | H01Q 5/40 |
| 2002/0036561 A1 | 3/2002 | Jedlitschka | |
| 2002/0182898 A1 | 12/2002 | Takahashi et al. | |
| 2005/0161300 A1 | 7/2005 | Green | |
| 2006/0202135 A1 | 9/2006 | Koitabashi | |
| 2006/0209487 A1 | 9/2006 | Schmidt et al. | |
| 2007/0076459 A1 | 4/2007 | Limpkin | |
| 2008/0129246 A1 | 6/2008 | Morita et al. | |
| 2008/0180279 A1 | 7/2008 | Hoerl et al. | |
| 2009/0058358 A1 | 3/2009 | Inoue et al. | |
| 2009/0085706 A1 | 4/2009 | Baarman et al. | |
| 2010/0097168 A1 | 4/2010 | Hahn et al. | |
| 2010/0156344 A1 | 6/2010 | Inoue et al. | |
| 2010/0181842 A1 | 7/2010 | Suzuki et al. | |
| 2011/0086256 A1 | 4/2011 | Julstrom et al. | |
| 2011/0241613 A1 | 10/2011 | Ryu et al. | |
| 2012/0154098 A1 | 6/2012 | Shimode et al. | |
| 2012/0217111 A1 | 8/2012 | Boys et al. | |
| 2013/0069444 A1 | 3/2013 | Waffenschmidt et al. | |
| 2013/0169398 A1 | 7/2013 | Sugita et al. | |
| 2013/0181667 A1 | 7/2013 | Takeshita et al. | |
| 2013/0249477 A1 | 9/2013 | Keeling et al. | |
| 2013/0300359 A1 | 11/2013 | Nakamura et al. | |
| 2014/0049212 A1 | 2/2014 | Sawa et al. | |
| 2014/0055089 A1 | 2/2014 | Ichikawa et al. | |
| 2014/0077615 A1 | 3/2014 | Stevens et al. | |
| 2014/0111002 A1 | 4/2014 | Horiuchi | |
| 2014/0240947 A1 | 8/2014 | Nakamura et al. | |
| 2014/0320078 A1 | 10/2014 | Nakamura et al. | |
| 2014/0340035 A1 | 11/2014 | Maekawa | |
| 2014/0346815 A1 | 11/2014 | Keutz et al. | |

FOREIGN PATENT DOCUMENTS

| | | |
|---|---|---|
| CN | 1954472 | 4/2007 |
| CN | 101138056 A | 3/2008 |
| DE | 20209092 U1 | 11/2003 |
| DE | 102006025458 A1 | 12/2007 |
| DE | 102006025460 A1 | 12/2007 |
| DE | 102007014712 A1 | 12/2007 |
| DE | 102006053681 A1 | 5/2008 |
| DE | 102011106027 A1 | 1/2013 |
| EP | 2172952 A1 | 4/2010 |
| EP | 2081792 B1 | 10/2012 |
| EP | 2675242 A1 | 12/2013 |
| GB | 1574247 | 9/1980 |
| GB | 2492825 A | 1/2013 |
| WO | 2008043326 A1 | 4/2008 |
| WO | 2011016737 A1 | 2/2011 |
| WO | 2011067708 A1 | 6/2011 |
| WO | 2011078552 A2 | 6/2011 |
| WO | 2011116394 A1 | 9/2011 |
| WO | 2012010649 A2 | 1/2012 |
| WO | 2012039077 A1 | 3/2012 |
| WO | 2012073704 A1 | 6/2012 |
| WO | 2012105040 A1 | 8/2012 |
| WO | 2012108135 A1 | 8/2012 |
| WO | 2012147341 A1 | 11/2012 |
| WO | 2012157114 A1 | 11/2012 |
| WO | 2013001586 A1 | 1/2013 |
| WO | 2013046366 A1 | 4/2013 |
| WO | 2013076804 A1 | 5/2013 |
| WO | 2013092215 A2 | 6/2013 |
| WO | 2013118745 A1 | 8/2013 |
| WO | 2013142064 A1 | 9/2013 |

* cited by examiner

RECEIVING DEVICE FOR RECEIVING A MAGNETIC FIELD AND FOR PRODUCING ELECTRIC ENERGY BY MAGNETIC INDUCTION

CROSS-REFERENCE TO RELATED APPLICATIONS

This application is the United States national phase of International Application No. PCT/EP2014/057087 filed Apr. 8, 2014, and claims priority to United Kingdom Patent Application No. 1306392.0 filed Apr. 9, 2013, the disclosures of which are hereby incorporated in their entirety by reference.

BACKGROUND OF THE INVENTION

Field of the Invention

The invention relates to a receiving device for receiving a magnetic field and for producing electric energy by magnetic induction, in particular for use by a vehicle. The invention also relates to a method of manufacturing such a receiving device and to an arrangement comprising the receiving device and a rectifier. In particular, the technical application lies in the field of wireless transfer of energy to vehicles, such as road automobiles, busses vans, trucks, but also load carriers, e.g. forklift trucks, and rail vehicles. The receiving device shall be adapted to produce electric power at least at rates in the kilowatt range, e.g. 20 kW.

Description Of Related Art

WO 2012/010649 A2 discloses an arrangement for receiving an electromagnetic field, for producing electric energy from the electromagnetic field by induction and for providing a load with the electric energy, in particular for providing a rail vehicle (e.g. a tram) or a road vehicle with energy. For producing electric energy by induction, the receiving arrangement comprises at least one inductor which may be realized by one or more than one windings of an electrical conductor. While a load is provided with electric energy from the receiving arrangement, the resulting alternating current produced by the inductor is rectified. An output side of the rectifier is connected to the load. The receiving arrangement may have three phases for receiving the electromagnetic field and the rectifier may be connected to the three phase lines of the receiving arrangement. Each phase comprises an inductance and a capacitance, which may be realized by in each case at least one capacitor.

There is a demand for the integration of such a receiving device or a different receiving device in existing motor vehicles, such as road automobiles. The weight of the receiving device should be small, since the maximum revenue load of the vehicle should be affected as little as possible. In addition, the construction of the receiving device and the mounting of the receiving device should be stable and also easy to assemble. Existing spaces especially in the region of the bottom of the vehicle's car body should be utilized. Typically, the magnetic field (as part of an alternating electromagnetic field) is produced by a device below the vehicle's bottom. Therefore, the receiving device which is typically mounted at the bottom of the vehicle receives the magnetic field from below, i.e. from the bottom side. However, it is possible to orient the receiving device in a different direction (such as the horizontal direction) if the magnetic field generating device is located in this direction. Generally speaking, the receiving device has a receiving side and, during operation, the magnetic field enters the receiving device or the case on the receiving side.

EP 2081792 B1 discloses a cladding element having a receiving unit integrated therein. The receiving unit comprises a receiver coil for contactless transmission of electrical energy and a plurality of flow conducting elements that are allocated to the receiver coil and designed to concentrate the field strength and are made from a material having high permeability compared with air.

It is an object of the present invention to provide a receiving device, a method of manufacturing such a receiving device and/or an arrangement comprising the receiving device and a rectifier, wherein the assembly of the receiving device and optionally as well as the rectifier is facilitated, wherein the receiving device can be mounted to a unit, in particular to a vehicle, in a stable manner and wherein existing spaces at the surface of the unit shall be utilized for receiving at least parts of the receiving device or the rectifier.

SUMMARY OF THE INVENTION

According to a basic idea of the present invention, the receiving device comprises a case which encloses at least one coil of an electric line and further components of the receiving device. At least one capacitor, which is electrically connected to the coil or to at least one of the coils, is arranged in a protruding portion of the case.

Using a case facilitates the assembly of the receiving device and the mounting of the receiving device to a unit (e.g. vehicle). Furthermore, arranging the at least one capacitor in a protruding portion of the case makes it possible to arrange the capacitor(s) in corresponding recesses of the unit's surface. This, in turn, improves stability of the mounting and reduces the size of the further space required for mounting the receiving device next to the surface of the unit. In particular, the bottom of an existing vehicle or of an existing type of vehicles typically comprises recesses in which the protruding portion of the case of the receiving device can be arranged. In many cases, road automobiles comprise a tunnel shaped recess area at the bottom of the car body. The tunnel shaped recess is elongated and extends in the direction of travel approximately along the center line of the vehicle. Therefore, it is preferred that the case of the receiving device has a correspondingly shaped protruding portion on the top side of the case or, more generally speaking, on the side opposite to the receiving side where the magnetic field enters the receiving device during operation.

Especially an elongated protruding portion, but also any other protruding portion could be used not only for housing the at least one capacitor or at least one of the capacitors, but could also be used for receiving electrical connections from the at least one coil of the receiver to external devices, such as the rectifier. In the case of the elongated protruding portion, the connection cables can extend along the longitudinal axis of the protruding portion. In particular, the connecting cables can be connected to the at least one coil in a central region of the receiving device (in contrast to a peripheral region) and can extend to the external device through the protruding portion.

Preferably, the coil or coils of the receiving device is/are combined with ferromagnetic and/or ferrimagnetic material (such as a ferrite), which is preferably arranged on the opposite side of the receiving side if viewed from the coil or coils. Since the magnetic state of the magnetic material may change, the synonym "magnetizable material" can be used as well. In particular, the magnetic material is arranged above the coil or coils, if the receiving side is the bottom side. Thus, the field lines of the magnetic field enter the receiving device on the receiving side, penetrate the area covered by the coil or coils and are re-directed and bundled within the magnetic material so as to return to the field generating device.

Preferably, the height (measured in the direction from the receiving side to the opposite side) of the magnetic material layer differs if the receiving device comprises coils for producing different phases of an alternating electric current, wherein coils of different phases overlap each other with respect to the areas that are covered by the coils. In particular, the covered area of a coil includes the whole area around which any winding of the coil circulates. The height of the magnetic layer is larger in a first region where coils of different phases overlap, and in particular where electric lines of different coils overlap each other, compared to a second region where there is no overlap of coils of different phases or electric lines of different coils.

In particular, a layer of electrically insulating material and/or of elastic material can be arranged between the coil or coils and the magnetic material. In case of electrically conducting magnetic material, this layer insulates and in case of an elastic layer, mechanic vibrations and wear of the coils and the magnetic material is prohibited.

If the height of the magnetic material differs, it is preferred that the height difference is compensated by additional material that is lighter in weight per unit volume compared to the magnetic material. Due to the height compensation it is possible to use planar elements in regions of the receiving device beyond the magnetic layer (if viewed from the coil or coils) and hollow spaces are avoided. For example, a layer of elastic material and/or a layer of electrically conducting material (which therefore shields electromagnetic radiation) and/or a layer of electrically insulating material (which might be the base plate of an electric circuit arrangement comprising the at least one capacitor and connecting electric lines for connecting the capacitor(s) and/or the coils to an external device may be placed on the region which is formed by the magnetic material and the height compensating material.

In particular, a receiving device is proposed for receiving a magnetic field and for producing electric energy by magnetic induction, in particular for use by a vehicle, wherein
the receiving device comprises at least one coil of an electric line, wherein the magnetic field induces an electric voltage in the coil during operation and wherein the coil comprises an inductance,
the receiving device and the coil are adapted to receive the magnetic field from a receiving side,
the receiving device comprises a case enclosing the at least one coil and further components of the receiving device,
the receiving device comprises at least one capacitor having a capacitance, which capacitor is electrically connected to the coil or to at least one of the coils so as to form an electric circuit having a resonance frequency according to the inductance(s) of the coil(s) and to the capacitance(s) of the capacitor(s),
the at least one capacitor being arranged on a side opposite to the receiving side, in a protruding portion of the case.

Furthermore, a method is proposed of manufacturing a receiving device for receiving a magnetic field and for producing electric energy by magnetic induction, in particular for use by a vehicle, wherein
a case having a protruding portion is provided for enclosing components of the receiving device to be manufactured,
at least one coil of an electric line is arranged within the case, wherein the coil comprises an inductance, so that the magnetic field can induce an electric voltage in the coil during operation of the receiving device,
the coil and its arrangement with in the case are adapted to receive the magnetic field from a receiving side,
at least one capacitor is provided, which capacitor has a capacitance and is electrically connected to the coil or to at least one of the coils so as to form an electric circuit having a resonance frequency according to the inductance(s) of the coil(s) and to the capacitance(s) of the capacitor(s),
the at least one capacitor is arranged on a side opposite to the receiving side, in the protruding portion of the case.

Preferably, the receiving device comprises more than one coil of an electric line for producing an electric voltage by induction. In particular, the receiving device may comprise a plurality of electric phase lines in order to produce different phases of an alternating electric current by the induction. Each phase line forms at least one coil. Preferably, all phase lines form the same number of coils.

In particular, the coil or coils comprise in each case at least one winding of the electric line (in case of at least two phases: the phase lines) and the winding or windings of the respective coil defines a central axis around which the electric line is wound. In particular, the windings of the respective coil may circulate around an area in each case, wherein the area is substantially the same for each winding of the respective coil. Furthermore, it is preferred that all coils of the receiving device have areas enclosed by the windings, which areas have substantially (with variations of only a few percent) the same size. The central axis mentioned above penetrates the area at its center. Preferably, the coil or coils of the receiving device is/are flat, i.e. the winding or windings of each coil extend(s) in a plane and the planes of any different windings of the same coil are identical or parallel to each other. In case of plural phases, sections of the electric lines of at least one of the coils may extend outside of the plane due to the fact that electric lines of different coils and/or phases overlap each other if viewed from the receiving side.

Preferably, not only the planes of different windings of the same coil, but also the planes of the windings of different coils are identical or parallel to each other so that the complete arrangement of the coils is flat, which means that the coils cover an area, which is penetrated by the magnetic field during operation and which is significantly wider and longer compared to the total height of the coil arrangement. In particular, the height may be smaller than ⅓, preferably one ⅕ and most preferred 1/10 of the width and length of the covered area. Consequently, the coil arrangement can be housed by a housing (which is the case mentioned above) that is shaped like a flat box, i.e. a box having a small height compared to its width and length.

More generally speaking, the case has a flat configuration defining a first surface on the receiving side and a second surface on the side opposite to the receiving side, wherein the first surface and the second surface are connected by surface areas of the case which are oriented in each case to another side than the receiving side and the side opposite to the receiving side and which are smaller than the first surface and the second surface.

In particular, the case comprises a first part that forms the first surface on the receiving side and comprises a second part that forms the second surface on the side opposite to the receiving side, wherein the second part comprises the protruding portion of the case.

As mentioned above, it is preferred that the protruding portion of the case is located in the center of the second surface. In particular, the protruding portion is elongated and extends along a center line of the second surface. In addition, or alternatively, the protruding portion of the case is elongated and contains the at least one capacitor as well as connecting electric lines which electrically connect—during operation of the receiving device—the at least one coil to another (external) device.

Embodiments of the method of manufacturing the receiving device follow from the description of the embodiments of the receiving device.

In addition, the invention refers to an arrangement comprising the receiving device, according to any embodiment described, and further comprising a rectifier, wherein the rectifier is electrically connected to the at least one coil of the receiving device and is adapted to rectify an alternating current produced by the at least one coil and wherein the rectifier is housed by a housing arranged in line with the protruding portion of the case of the receiving device.

The arrangement in line with the protruding portion means that the housing of the rectifier and the protruding portion can be arranged in an elongated recess of the surface of a unit (e.g. a vehicle), in particular at the bottom of the car body of the vehicle. If the protruding portion is elongated and comprises in particular a longitudinal axis along which the protruding portion extends, the housing of the rectifier preferably also extends along the longitudinal axis. However, there is an optional gap in between the protruding portion and the housing of the rectifier. In particular, connecting cables may extend within the gap so as to electrically connect the interior of the protruding portion with the rectifier. Preferably, the housing of the rectifier also has an elongated shape and extends along the longitudinal axis of the elongated protruding portion. Furthermore, it is possible that the height of the rectifier's housing is larger than the height of the receiving device's case with the exception of the protruding portion. This means that the case has a larger height if measured at the protruding portion compared to other regions. Preferably, the surface on the receiving side of the case is planar (i.e. extends within a plane).

BRIEF DESCRIPTION OF THE DRAWINGS

Examples of the invention will be described with reference to the attached drawing. The figures of the drawing show:

FIG. 1 an example of a case of a receiving device in a three dimensional view, FIG. 2 a view of a side face of the case shown in FIG. 1, FIG. 3 an exploded view of the case shown in FIG. 1 and FIG. 2 with the interior components of the receiving device, according to a specific embodiment, i.e. the interior components may be varied, FIG. 4 an example of an arrangement of coils, in particular the arrangement shown in

FIG. 3,

DETAILED DESCRIPTION OF THE INVENTION

Figure 1:
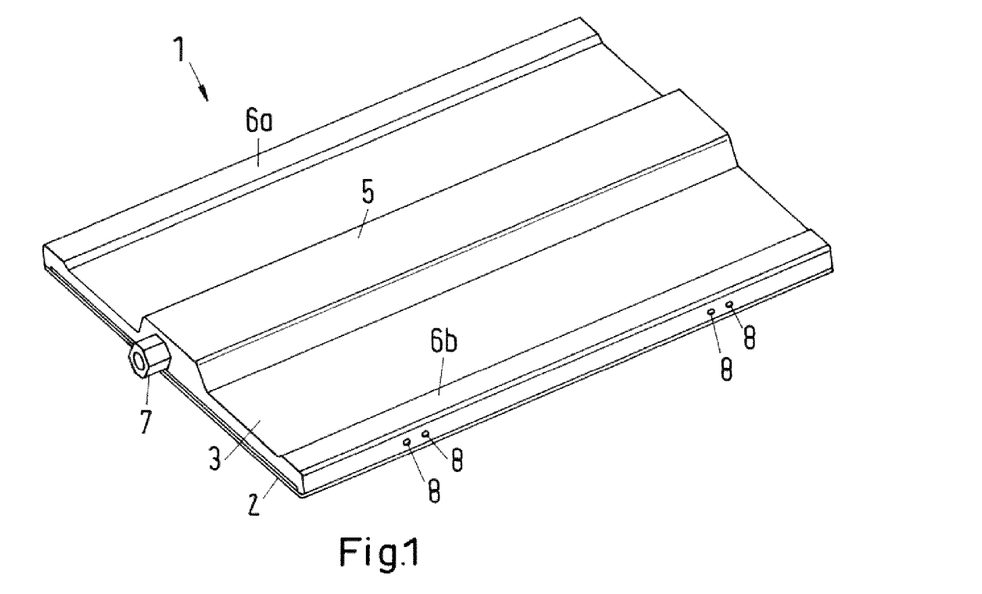
Figure 2:
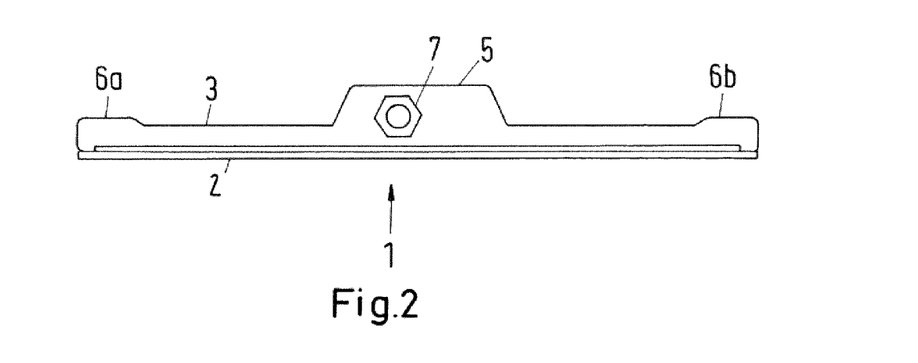

The receiving device 1 shown in FIG. 1 and FIG. 2 comprises a case having a base plate 2 and a top part or cover 3. While the base plate 2 forms a planar surface on the underside (the receiving side of the receiving device to be housed by the case), the top surface formed by the cover 3 is not planar as a whole, but only comprises planar regions. The cover 3 has three elongated protruding portions 5, 6a, 6b which protrude to the top side (the side opposite to the receiving side of the case or receiving device).

In the embodiment shown in FIG. 1 and FIG. 2, the cover 3 forms the main sections of the side surfaces of the case 1. In alternative embodiments, the case may comprise more than two parts forming the outer surfaces and/or larger parts of the side surfaces may be formed by the base part which corresponds to the base plate 2 in FIG. 1 and FIG. 2.

As shown in FIG. 1, the side surfaces of the case comprise a plurality of means for fixing the case 1 to a vehicle, in particular to a frame construction of the vehicle. For example, the fixing means 8 may be threaded holes for screwing the case to the vehicle.

The protruding portions 5, 6a, 6b of the cover 3 are elongated, i.e. in each case comprise a longitudinal axis along which they extend. Preferably, the protruding portions extend along the whole length of the case and preferably have the same profile along their extension in longitudinal direction.

The protruding portion 5 is located in the center of the case (if viewed in width direction) and extends along the center line of the case, i.e. in lengthwise direction of the case. The cross section of the protruding portion 5 is trapezoidal, wherein the cross section tapers to the free top end of the protruding portion 5.

According to the specific embodiment shown in FIG. 1 and FIG. 2, the central protruding portion 5 has an opening in the side face shown in FIG. 2 which opens to a tubular connecting part 7 that can be used for receiving electric connection lines or cables.

Variations of the embodiment shown in FIG. 1 and FIG. 2 are possible, such as a case having the protruding portion 5 along the center line, but does not have the side protruding portions 6a, 6b or only having one of these side protruding portions.

Figure 3:
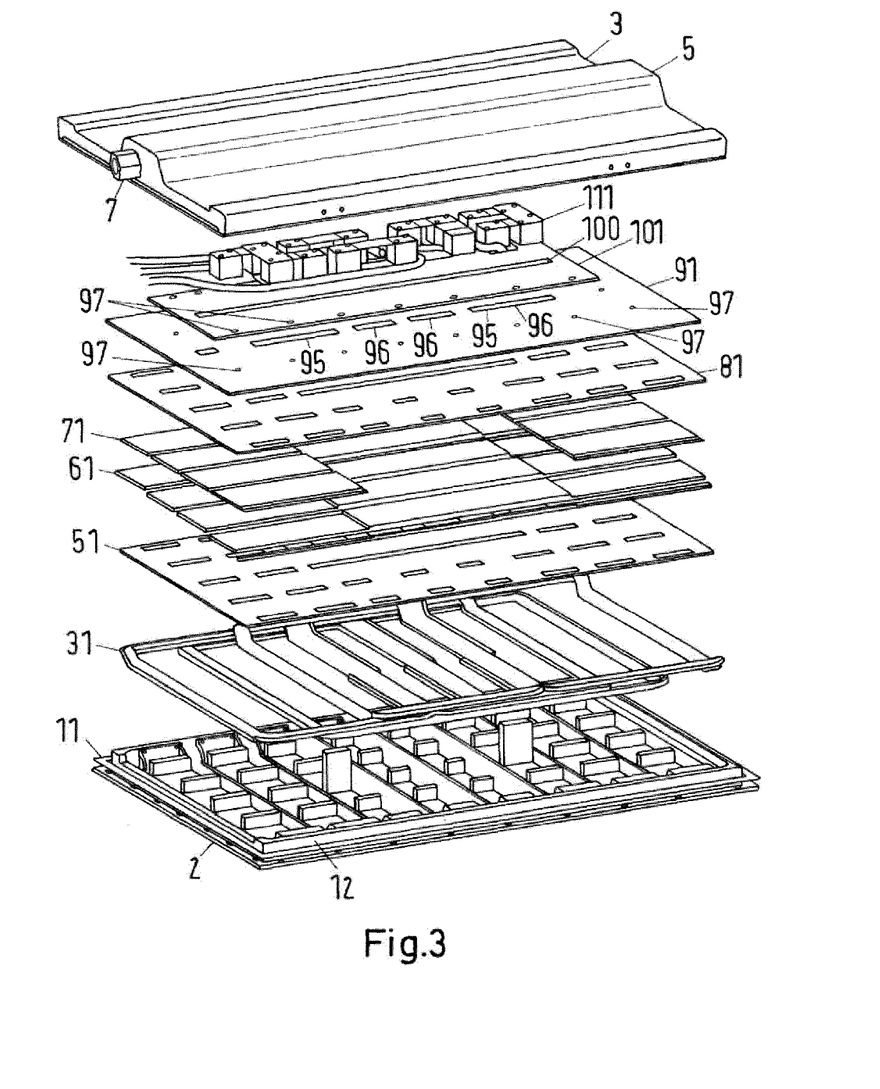

The exploded view of FIG. 3 shows a specific embodiment of a receiving device, wherein the components of the receiving device are housed by the case shown in FIG. 1 and FIG. 2.

The base part 2 of the case carries a holding device 12 for holding other interior components of the receiving device, in particular electric lines that form in each case two coils of three phases. In addition, the holding device 12 comprises a plurality of columns for separating, holding and/or fixing components of the receiving device which are located above the coils. In particular, at least one intermediate layer of insulating and/or elastic material, magnetic material, a layer of electrically conducting shield material and/or a base plate for an electric circuit arrangement can be separated, held and/or fixed using one or more than one of the columns.

When the cover 3 of the case is mounted to the base plate 2 of the case, the outer rim of the cover 3 abuts on a sealing 11 which is positioned in the periphery of the holding device 12 and is supported by the rim of the base plate 2.

Figure 4:
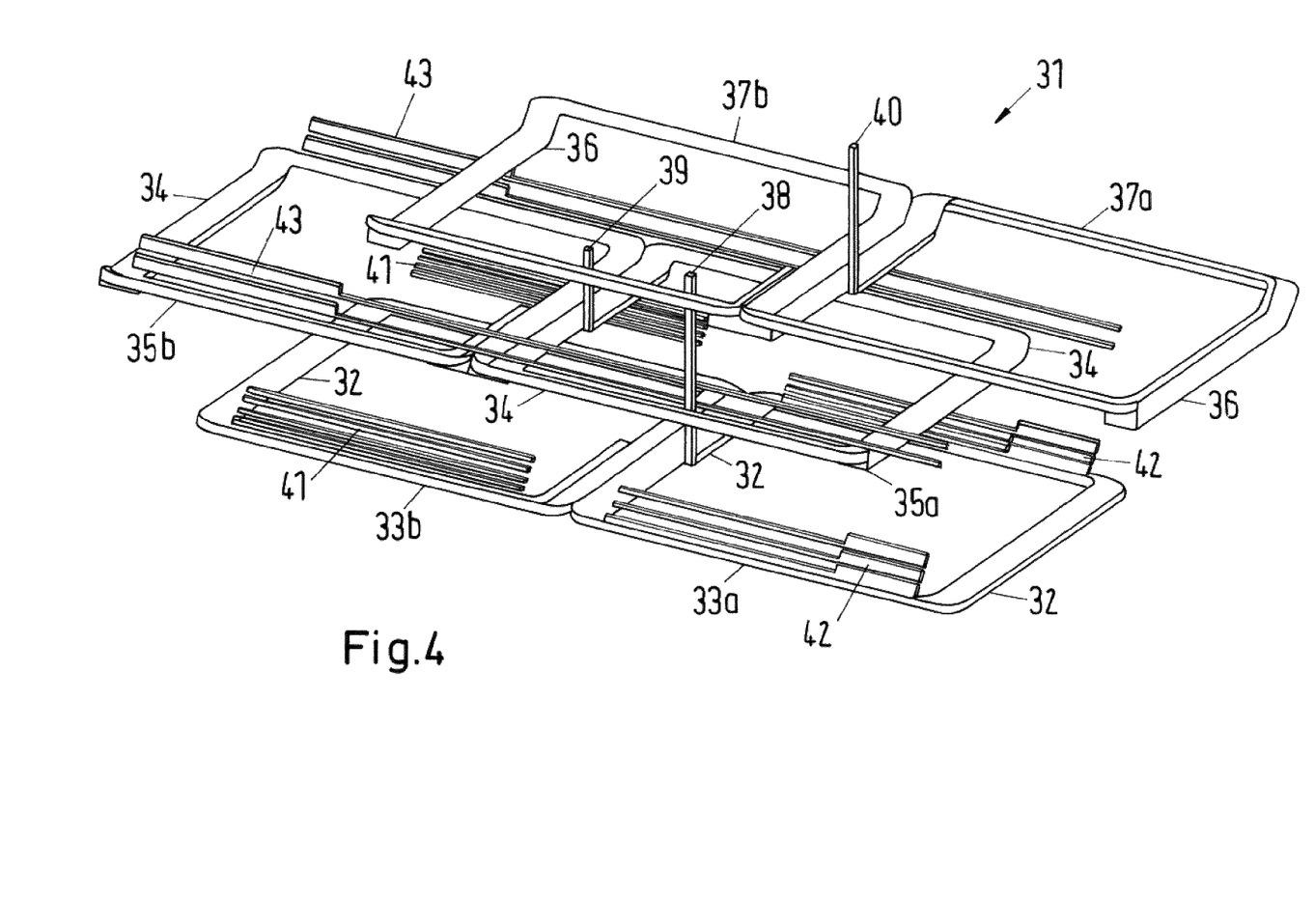

A coil arrangement 31 is positioned within pre-defined receiving spaces of the holding device 12. Since the different electric lines (phase lines) for producing the different phases of an alternating current form coils which overlap each other if viewed from the top (from the cover 3), the phase lines of at least two of the phases rise nearby the longitudinal sides of the coil arrangement so that they extend along the longitudinal side one upon the other, where they overlap. Details of a specific embodiment of this kind are shown in FIG. 4 and will be described later.

The coil arrangement 31 is covered by a layer 51 of elastic material which is preferably also electrically insulating. The layer 51 may be formed by a single piece of material or by a plurality of pieces.

An arrangement 61 of magnetizable material, in particular ferrimagnetic material or alternatively ferromagnetic material, is placed on the intermediate layer 51. Preferably, the height (i.e. the depth) of the magnetic material differs and is larger above (i.e. behind) regions where the density (number per length) of the electric lines of the coil arrangement 31 is higher.

Preferably, compensating material 71 is placed where the height of the magnetic material 61 is smaller so that the height of the total arrangement of magnetic material 61 and compensating material 71 is constant or, at least, varies less than the height of the magnetic material 61.

In the specific embodiment shown in FIG. 3, a second intermediate layer 81, which may be have the features described above for the intermediate layer 51, is placed on top of the magnetic material 61 or the compensating material 71.

A shielding layer 91 made of electrically conducting material, for example aluminum, is placed on top of the second intermediate layer 81. The shielding layer 91 has cut outs 95 so that at least some of the columns of the holding device 12 can extend through the cut outs 95. Some cut outs or regions 96 of the cut outs can be used for placing sections of electric connections between the coil arrangement 31 and the electric circuit 111 that is placed above the shielding layer 91.

The circuit arrangement 111 is placed on a sheet-like carrier 101, such as a conventional circuit board. There is a cut out 100 in the carrier 101 so that electric connections between the circuit arrangement 111 and the coil arrangement 31 can extend through the cut out 100.

In the specific embodiment shown in FIG. 3, the carrier 111 and the shielding layer 91 comprise bores 97 or other cut outs which allow for fixing the carrier 101 to columns of the holding device 12 so that the complete arrangement of interior components of the receiving device is fixed to the holding device 12. In particular, the electric circuit arrangement 111 can be fixed to the carrier, for example by soldering, and the holding device 12 can be fixed to the base plate 2 of the case, such as by gluing or screwing. Preferably, screws are also used to fix the carrier 101 to the columns of the holding device 12.

A preferred embodiment of the coil arrangement 31 is shown in FIG. 4. The coil arrangement consists of six coils 33a, 33b, 35a, 35b, 37a, 37b, two coils per phase line 32, 34, 36. The coils of each phase line are placed next to each other on the same height level of the receiving device. FIG. 4 shows an exploded view of the coil arrangement 31.

To form the two coils of one phase, the respective phase line 32, 34, 36 is wound starting at one end of a first coil around the area to be covered so as to form the first coil and further extends around the area to be covered by the second coils so as to form the second coil. In the example shown in FIG. 4, each coil may comprise two to five windings. The number of the windings of the phase lines 32, 34, 36 is not shown in the figures.

As mentioned before, the coils of the different phases overlap each other partially in the middle region of the coil arrangement 31. The phase lines 32, 34, 36 are placed one upon the other where the coils overlap. Since transversally extending sections of the different phase lines 32, 34, 36, which sections connect the longitudinal sides, are placed on the same height level in the finished coil arrangement 31, at least the phase lines 34, 36 rise along their extension next to the longitudinal sides of the coils. The holding device 12 defines spaces for receiving these transversely extending sections of the phase lines, wherein the spaces are on the same height level.

Although the phase lines 32, 34, 36 are preferably electrically insulated at their surfaces, the coils 33, 35, 37 of the different phases are preferably placed upon each other using distance pieces 41, 42, 43. These pieces are placed in between the phase lines 32, 34, 36 where they are placed one upon the other. In particular, there are three types of distance pieces. The first type 41 is used where the phase line 34 of the second phase is placed above the phase line 32 of the first phase along the longitudinal side of the coil arrangement 31. The first type 41 of distance pieces is elongated and extends along the longitudinal side and, at the same time, along the phase lines 32, 34 so as to form a distance between the phase lines 32, 34. The first type 41 of the distance pieces has a constant cross section. It is used for the second coil 33b of the first phase.

The second type 42 of distance pieces does not have a constant cross section, but the end region shown on the right hand side of FIG. 4 is significantly higher than the other sections. Where the distance pieces 42 are higher, the first coil 33a of the first phase supports the first coil 37a of the third phase. Where the height of the distance pieces 42 is smaller, the first coil 33a of the first phase supports the first coil 35a of the second phase.

The third type 43 of the distance pieces also has a non-constant, varying cross section. The end regions of the distance pieces 43 are higher than the other regions. Where the height is larger, the second coil 35b of the second phase supports other components of the receiving device which are placed above the coil arrangement 31. Where the height of the distance pieces 43 is smaller, the second coil 35b or the first coil 35a of the second phase supports the first or second coil 37a, 37b of the third phase.

In particular, the number of the distance pieces 41, 42, 43 depends on the number of windings per coil. Since the number of windings may differ in different embodiments of the arrangement, FIG. 4 shows different numbers of the different types of the distance pieces 41, 42, 43. However, in practice, it is preferred that all coils comprise the same number of windings and, consequently, that the numbers of the different types of distance pieces are equal.

The longitudinal section of the coil 33b of the first phase is fully overlapped by the coils 35a, 35b of the second phase. If the coils 35a, 35b are placed on top of the coils 33a, 33b, the transversely extending section at the side face of coil 35b is placed outside of the area which is covered by the second coil 33b of the first phase. The transversely extending section of the second phase which comprises sections of the first coil 35a and the second coil 35b is placed in the area around which the phase line 32 of the second coil 33b of the first phase extends. The transversely extending section of the first coil 35a of the second phase is placed in the area around which the phase line 32 of the first coil 33a of the first phase extends. The corresponding arrangement can be perceived from FIG. 3: the transversely extending sections of the coils are separated from the neighbouring transversely extending section of another coil in each case by at least one of the columns. In the example shown, there are five columns in each case in between two neighbouring transversely extending sections.

The coils 35 of the second phase and the coils 37 of the third phase are shifted in a similar manner relative to each other as the first phase and the second phase, but the shift length in longitudinal direction is twice as large as the shift length of the first and second phase. As a result, the transversely extending section at the side face of the first coil 37a of the third phase is placed outside of the area around which the phase line 32 of the first coil 33a of the first phase extends. On the other hand, the shift length in longitudinal direction of the third phase relative to the first phase has the same amount as the shift length of the first phase and the second phase, but is oriented in the opposite direction if viewed from the first phase coil arrangement.

At least one end of the phase line 32, 34, 36 which forms the coils of the respective phase is connected to a line section or forms a line section that extends upwards from the coils. Respective upwardly extending sections 38, 39, 40 are shown in FIG. 4. The other ends of the phase lines 32, 34, 36 can directly be connected to each other (not shown in FIG. 4) so as to form an electrical star point. Since at least one end of each phase line 32, 34, 36 is connected to an upwardly extending section 38, 39, 40, the coil arrangement can be electrically connected in a different region (in particular on a higher level) of the receiving device, in particular to components which are located in the protruding portion of the case. In particular, the upwardly extending sections 38, 39, 40 are connected to in each case at least one capacitor of the circuit arrangement 111 shown in FIG. 3 and FIG. 9.

Figure 5:
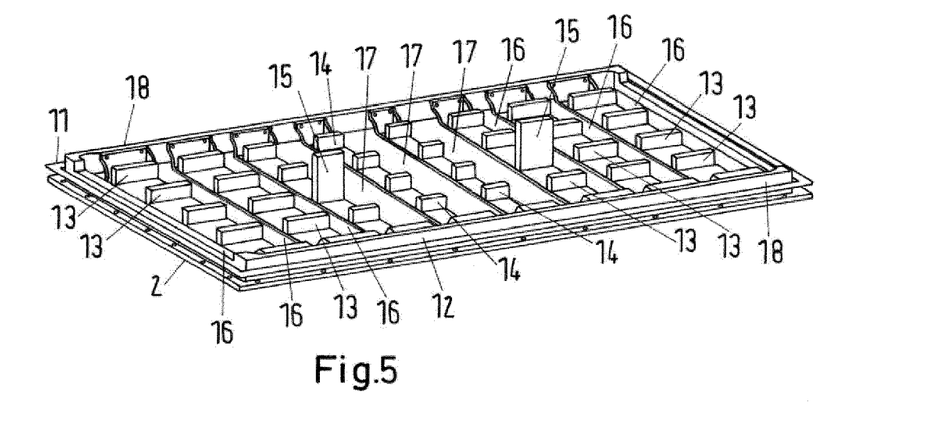
FIG. 5 a base part of the case shown in FIG. 1 and FIG. 2 with a specific embodiment of an arrangement of components for positioning and/or fixing interior components of the receiving device, FIG. 6 a layer of electrically insulating elastic material for covering the coil arrangement of a receiving device, FIG. 7 schematically an intermediate layer of the interior of a receiving device, such as the layer shown in FIG. 6, and a plurality of blocks made of magnetic material in an exploded view, FIG. 8 schematically a side view of an arrangement of interior components of a receiving device, comprising a plurality of coils, an intermediate layer and an arrangement of magnetic material elements as well as height compensating elements, FIG. 9 a base plate made of electrically insulating material and an arrangement of capacitors and connecting lines in an exploded view, wherein the capacitors and connecting lines are to be positioned within a protruding portion of a case, FIG. 10 an arrangement of the case shown in FIG. 1 and a rectifier, FIG. 11 schematically a road vehicle and an arrangement for inductively transferring energy to the road vehicle, wherein a receiving device for receiving a magnetic field is integrated at the bottom of the vehicle, FIG. 12 schematically a cross section through a part of an arrangement similar to the arrangement shown in FIG. 5 in combination with the arrangement shown in FIG. 7 and FIG. 13 schematically a cross section through a part of an arrangement similar to the arrangement shown in FIGS. 4 and 5 in combination with the arrangement shown in FIG. 7, wherein the image plane of FIG. 13 extends perpendicularly to the image plane of FIG. 12.

The enlarged view of the base plate 2 and the holding device 12 shown in FIG. 5 comprises a plurality of columns 13, 14, 15 which extend upwards from the basis of the holding device. A preferred material of the holding device 12 is plastic, such as a polymer. Preferably, the basis of the holding device 12 is sheet-like forming a planar or merely planar outer surface facing to the base plate 2. Preferably, the columns 13, 14, 15, the basis and optionally further portions (e.g. holding portions for holding electric lines or bundles of electric lines) of the holding device 12 are formed as an integral part, for example by injection moulding. Alternatively, at least one of the columns 13, 14, 15 can be manufactured as a separate piece and can be fixed to the basis.

The holding device 12 comprises holding portions 16, 17 for holding electric lines or bundles of electric lines. Depending on the number of the electric lines or bundles of electric lines to be held by the individual holding portion 16, 17, the holding portions are wider or narrower (with respect to the longitudinal direction). In the example shown in FIG. 5, the first three holding portions 16 from the left and from the right in the figure are narrower than the three holding portions 17 in the middle.

The columns 13, 14, 15 are arranged in lines extending in the longitudinal direction (from left to right in FIG. 5) and rows extending in transverse direction (from front to back in FIG. 5). There are spaces in between the rows of columns and beyond the first and last row, wherein these spaces are adapted to receive the respective transversely extending sections of the coils of the coil arrangement, in particular the coil arrangement 31 as shown in FIG. 4. In the specific embodiment shown in FIG. 5, the width of these spaces as measured in the longitudinal direction differs corresponding to the number of sections of electric lines which are to be placed side by side to each other on the same height level. Consequently, in view of the coil arrangement 31 shown in FIG. 4, the first three spaces have a smaller width which is in particular half as wide as the width of the three spaces in the middle of the holding device 12.

The lines of the columns 13, 14, 15 are spaced so that pieces of magnetic material and optionally compensating material can be placed in between in each case two of the columns.

In addition, at least one of the columns 13, 14, 15 can be used for fixing other components of the receiving device to the column and thereby to the holding device 12.

Therefore, the columns combine different functions, in particular separating different transversely extending sections of coil, separating different pieces of material, such as magnetic material and compensating material, and/or fixing other components to the respective column. A further possible function is separating components of the receiving device from the basis of the holding device and/or from the basis of the receiving device at the receiving side. "Separating" means that the respective components or parts cannot contact each other. The respective dimension of the column, either in longitudinal direction, in transverse direction or in height direction, defines the minimum distance between the two parts or components which are separated.

In addition, as mentioned before, the specific embodiment of the holding device 12 shown in FIG. 5 comprises elevated rims 18 along the longitudinal sides. In any case, the rims of the holding device along the longitudinal sides are adapted to receive the corresponding sections of the coil arrangement.

Preferably, the spaces for receiving the phase lines of the coil arrangement have shaped surfaces, in particular grooved surfaces, so that the phase lines are held in place and do not slip. In particular, these spaces can be provided by holding portions of the holding device.

Figure 9:
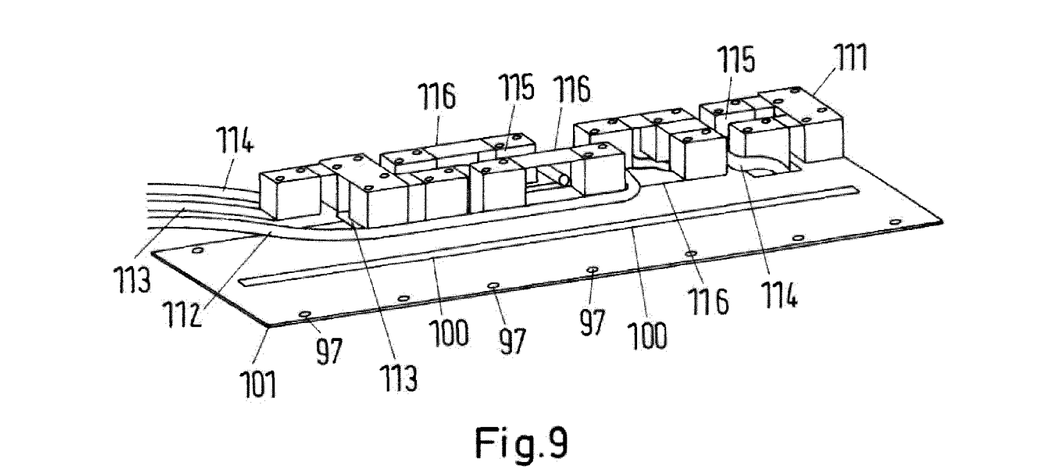

In particular, two columns 15 of the holding device 12 are higher than the other columns 13, 14 and serve to position and/or fix the carrier 101 and the circuit arrangement 111 shown in FIG. 3 and FIG. 9.

Figure 6:
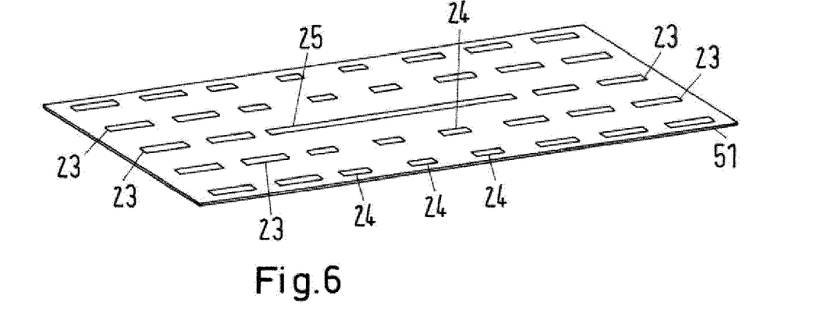

The intermediate layer 51 (and optionally the intermediate layer 71) shown in FIG. 3 are shaped as shown in FIG. 6.

The layer 51 may be made of an elastic material, such as silicone. The layer 51 comprises a plurality of cut outs 23, 24, 25 which are arranged in lines and rows similarly to the lines and rows of the columns 13, 14, 15 of the holding device 12. Preferably, the cut outs 23, 24, 25 are sized so that the columns may extend through the cut outs while abutting to the surfaces of the cut outs 23, 24, 25. It is preferred that the surfaces of the cut outs 23, 24, abut to the surface of the respective column 13, 14 all around the column. In the center line of the receiving device and, therefore, of the layer 51, there is the cut out 25 which has a length that is larger than the length of the columns 15. This allows for passing other components through the cut out 25. In particular, the upwardly extending line sections 38, 39, 40 shown in FIG. 4 may extend through the cut out 25.

Figure 7:
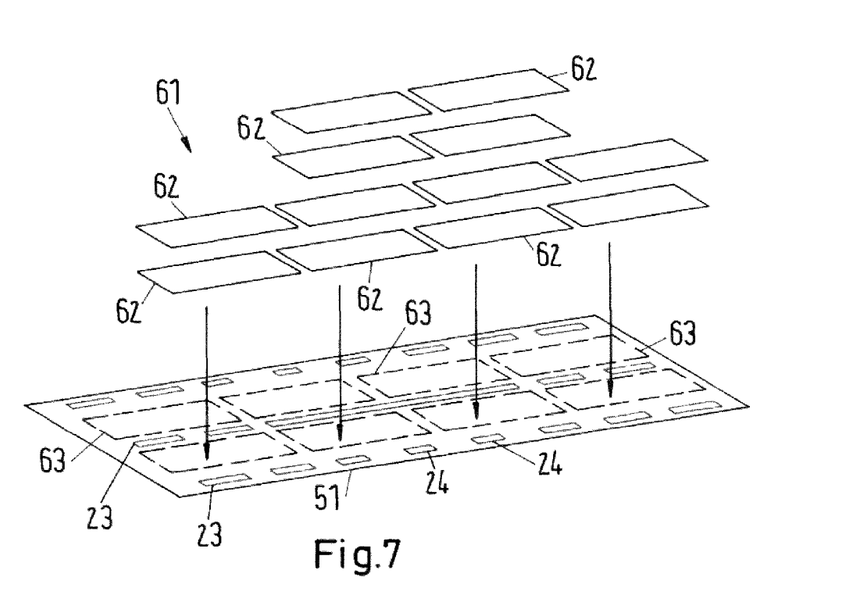
Figure 8:
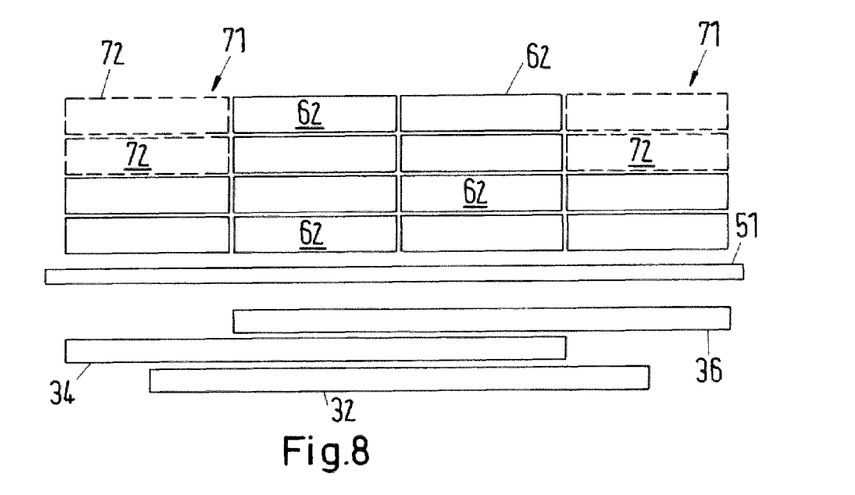

FIG. 7 and FIG. 8 schematically show the arrangement of a plurality of magnetic material pieces 62 (e.g. pieces having the shape of a cuboid) which is to be placed on an intermediate layer 51 which may be the intermediate layer 51 shown in FIG. 6. However, the number of cut outs 23, 24 and their shapes may vary from embodiment to embodiment. In addition, the arrangement can be used with a different type of receiving device as described with reference to the figures. FIG. 7 and FIG. 8 show the principle of placing magnetic material above the coil arrangement of a receiving device, independent of the interior components used in the receiving device and independent of the specific dimensions of the interior components of the receiving device.

In FIG. 7, areas 63 where magnetic material pieces 62 are to be placed are indicated by dashed outlines. For a first line of such areas 63, the pieces 62 are shown in the exploded view of FIG. 7. There are four pieces 62 to be placed on top of the two areas 63 in the middle of the line and there are only two pieces 62 to be placed on the two areas 63 at the end of the line. The resulting stacked arrangement of pieces 62 is schematically shown in FIG. 8. Since all pieces 62 have the same dimensions, the two stacks in the middle are twice as high as the two stacks at the opposite ends of the line. The motivation for these different total heights of magnetic material is the overlap of the different phase lines 32, 34, 36 which form the coils of the different phases, for example as shown in FIG. 4. Higher magnetic field strengths caused by more electric lines require more magnetic material.

In order to compensate for the different heights of the magnetic material, compensating material 72 is placed as shown in FIG. 8.

FIG. 7 also shows the cut outs 23, 24 and that the lines of areas where the magnetic material is to be placed are located in between the lines of the cut outs 23, 24. In longitudinal direction, it is preferred that the magnetic material pieces 62 abut to each other (in contrast to the small distances shown in FIG. 8). As preferred, at least one column (not shown in FIG. 7) and preferably a plurality of columns extend(s) in each case through one of the cut outs 23, 24, thereby separating the lines of the magnetic material pieces 62.

Variations of the embodiment of a field shaping arrangement shown in FIG. 7 and FIG. 8 are possible. In particular, it is not necessary to combine the arrangement with one of the intermediate layers or any of the intermediate layers shown in FIG. 6. Furthermore, the columns can be omitted. In addition, the shape of the elements made of magnetizable material may be different. However, shapes are preferred which allow for producing a mosaic of elements having seams between the elements, but no other hollow spaces.

FIG. 9 shows an enlarged view of the carrier 101 and of the electric circuit arrangement 111 which is carried and preferably fixed on the carrier 101. There is a plurality of block-shaped capacitors 115, some of which are electrically connected to each other by plate-like electrical connectors 116. In addition, the capacitors 115 are electrically connected to the respective coil in particular via the upwardly extending connecting sections 38, 39, 40 shown in FIG. 4 and are electrically connected via connection lines 112, 113, 114 to an external device, in particular to the rectifier 120 shown in FIG. 10. These external connection lines 112, 113, 114 can be guided through the connecting part 7 shown in FIG. 1 and FIG. 2.

Figure 10:
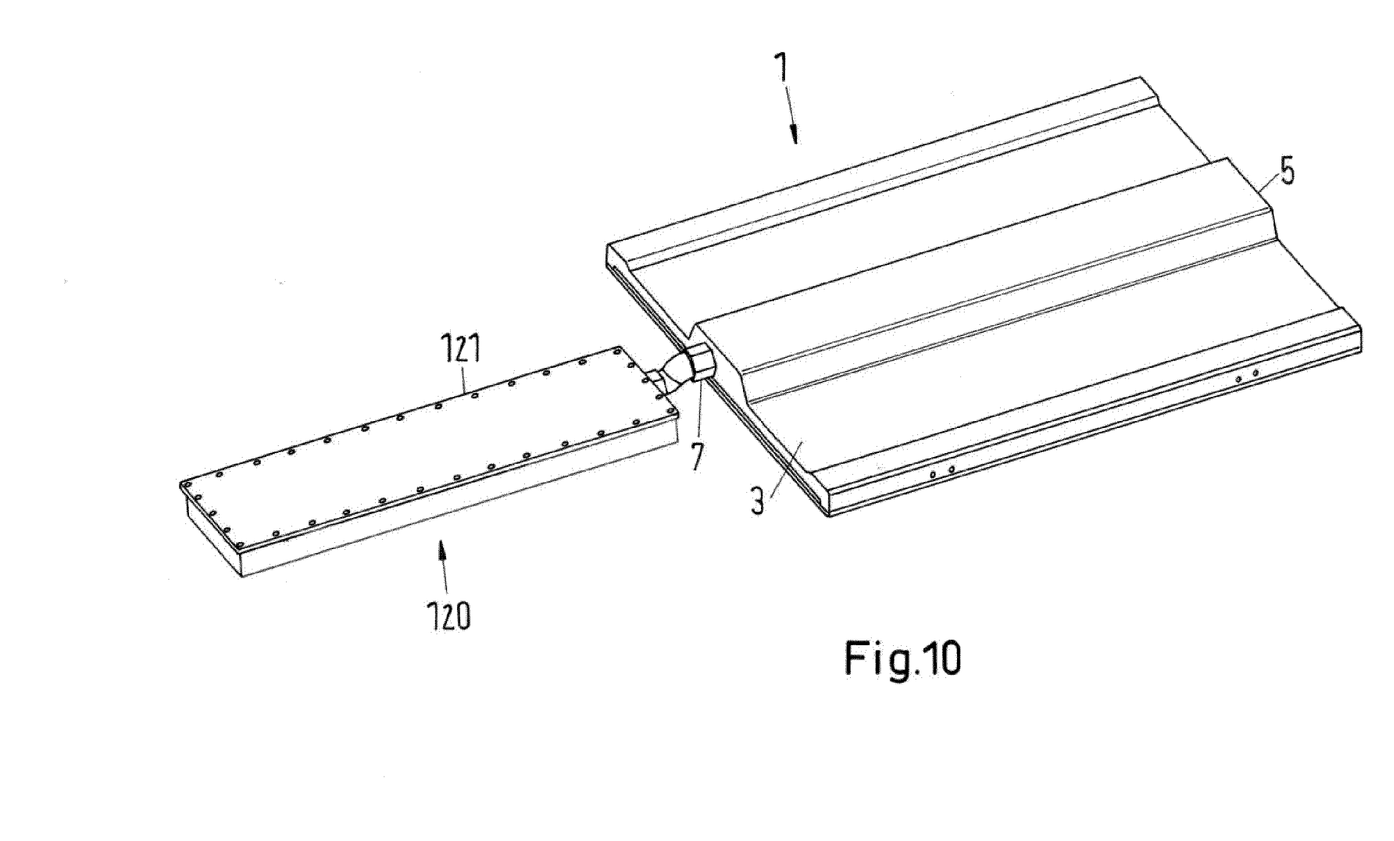

At least the upper part of the circuit arrangement 111 shown in FIG. 9 can be placed within the protruding portion 5 of the cover 3 of the case shown in FIG. 1 and FIG. 10. The protruding portions 6a, 6b of the cover 3 along the longitudinal sides are preferably used for receiving at least sections of the phase lines and optionally of the spacing pieces of the coil arrangement, such as the circuit arrangement 31 shown in FIG. 4.

FIG. 10 shows the receiving device 1 of FIG. 1 and a rectifier 120 which is housed by a housing 121. In particular, the connecting lines 112, 113, 114 shown in FIG. 9 connect the receiving device 1 with the rectifier 120.

Figure 11:
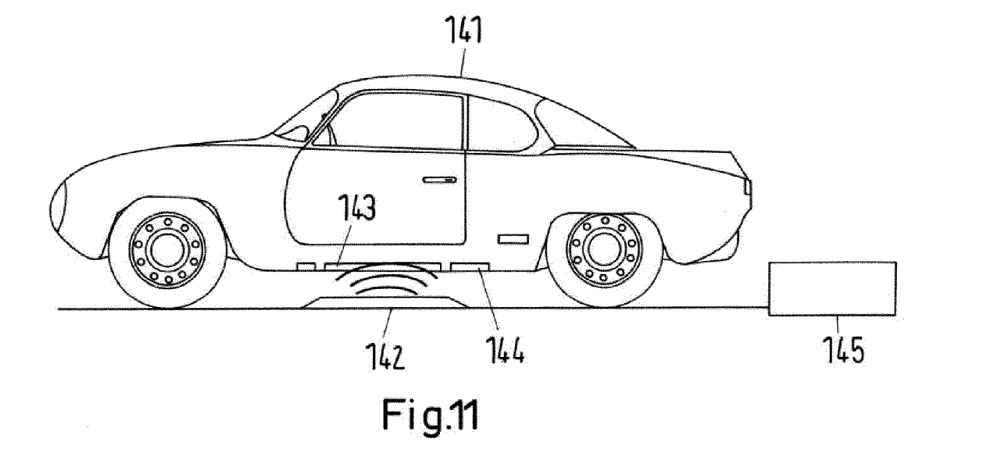

The central protruding portion 5 of the receiving device 1 is elongated and extends along a longitudinal axis which is also the longitudinal axis of the housing 121 of the rectifier 120. This arrangement can be placed in corresponding recesses formed by the bottom surface of the car body of a road vehicle. Such a road vehicle 141 is shown in FIG. 11. The location of the receiving device is schematically indicated by a block with reference numeral 143 and the location of the rectifier is schematically indicated by a block with reference numeral 144.

During energy transfer to the vehicle, a generating device 142 generates the magnetic field, in particular by generating an alternating electromagnetic field. The magnetic field is indicated by three curved lines. The generating device 142 is provided with electric current from corresponding equipment 145, which may include an inverter and/or an AC/AC converter.

Figure 12:
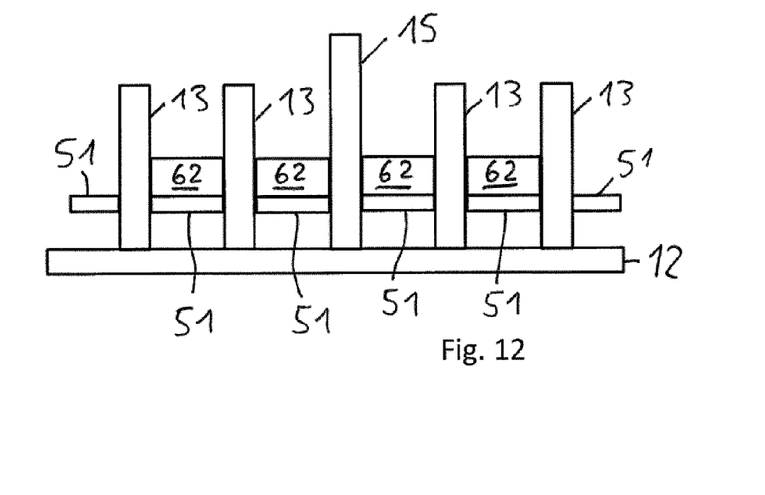

FIG. 12 shows five columns 13, 15 which extend upwards from a base plate of a separating structure 12, wherein the receiving side of the receiving device is at the bottom of the figure. A layer 51 of elastic material extends at a distance and parallel to the base plate. In a similar manner as shown in the exploded view of FIG. 8, pieces of magnetic material 62 are laid on the layer 51 in between the columns 13, 15. Consequently, the columns 13, 15 separate the pieces of magnetic material 62. In addition, the columns 13, 15 extend through cut outs of the layer 51.

Figure 13:
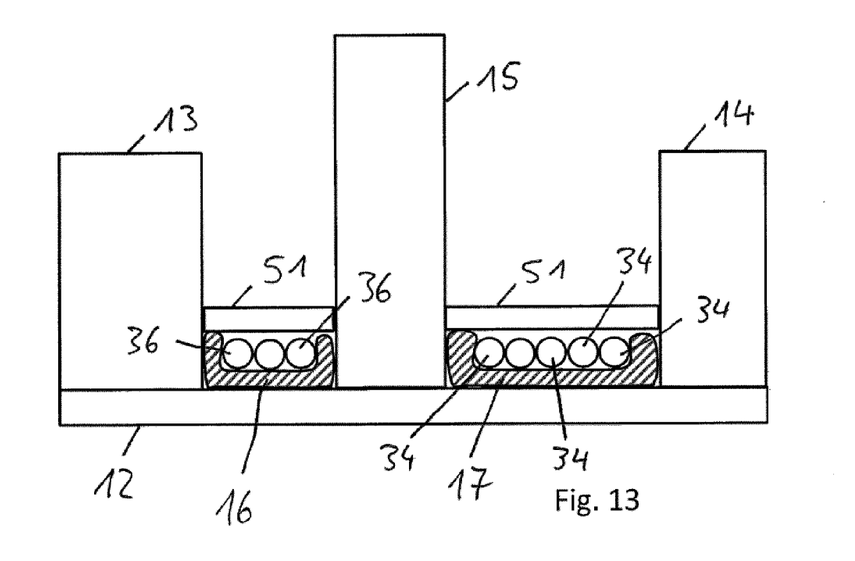

FIG. 13 shows three columns 13, 14, 15 which extend upwards from a base plate of a separating structure 12, wherein the receiving side of the receiving device is at the bottom of the figure. In the same manner as shown in FIG. 12, the layer 51 of elastic material extends at a distance and parallel to the base plate. While FIG. 12 shows a region of the arrangement where no electric lines of the coil arrangement are positioned in between the base plate and the layer 51, FIG. 13 shows a region of the arrangement where bundles of electric lines, in particular the phase lines 34, 36 of the arrangement shown in FIG. 4, of the coil arrangement are positioned in between the base plate and the layer 51. The bundles are held by holding portions 16, 17 of the separating structure 12. The holding portions 16, 17 in each case form a groove for receiving the electric lines 34, 36. In case of the receiving portions 16, there are three electric lines 36 side-by-side in the groove. In case of the receiving portions 17, there are five electric lines 34 side-by-side in the groove. In alternative embodiments, the electric lines may be held in a different manner, for example using a groove for each single electric line and/or with electric lines not or not only side-by-side in the longitudinal direction (horizontal direction in FIG. 13), but stacked. Consequently, the column 15 separates the holding portions 16, 17 and thereby the bundles of electric lines 34, 36. In addition, the column 15 extends through a cut out of the layer 51.

Modifications of the arrangement shown in FIG. 12 and FIG. 13 are possible. For example, the numbers and/or dimensions of the elements and components shown in the figures may vary. In addition, the columns may be used for separating, holding and/or fixing other components of the receiving device in addition to the components shown in the figures or alternatively to the at least a part of the components shown in the figures.

The invention claimed is:

1. A receiving device configured to receive a magnetic field and to produce electric energy by magnetic induction, wherein
   the receiving device comprises at least one coil of an electric line, wherein the magnetic field induces an electric voltage in the coil during operation and wherein the coil comprises an inductance,
   the receiving device and the coil are adapted to receive the magnetic field from a receiving side,
   the receiving device comprises a case enclosing the at least one coil and further components of the receiving device,
   the receiving device comprises at least one capacitor having a capacitance, which capacitor is electrically connected to the coil or to at least one of the coils so as to form an electric circuit having a resonance frequency according to the inductance(s) of the coil(s) and to the capacitance(s) of the capacitor(s),
   the at least one capacitor being arranged on a side opposite to receiving side, in a protruding portion of the case.

2. The receiving device of claim 1, wherein the case has a flat configuration defining a first surface on the receiving side and a second surface on the side opposite to the receiving side, wherein the first surface and the second surface are connected by side surface areas of the case which are oriented for each side surface area to another side than the receiving side and the side opposite to the receiving side and which are smaller than the first surface and the second surface.

3. The receiving device of claim 2, wherein the protruding portion of the case is located in a centre of the second surface.

4. The receiving device of claim 3, wherein the protruding portion is elongated and extends along a centre line of the second surface.

5. The receiving device of claim 1, wherein the protruding portion of the case is elongated and contains the at least one capacitor as well as connecting electric lines which electrically connect —during operation of the receiving device the at least one coil to another device.

6. The receiving device of claim 1, wherein the case comprises a first part that forms a first surface on the receiving side and comprises a second part that forms a second surface on the side opposite to the receiving side, wherein the second part comprises the protruding portion of the case.

7. An arrangement comprising the receiving device of claim 1 and further comprising a rectifier, wherein the rectifier is electrically connected to the at least one coil of the receiving device and is adapted to rectify an alternating current produced by the at least one coil and wherein the rectifier is housed by a housing arranged in line with the protruding portion of the case of the receiving device.

8. A method of manufacturing a receiving device configured to receive a magnetic field and to produce electric energy by magnetic induction, wherein
   a case having a protruding portion is provided for enclosing components of the receiving device to be manufactured,
   at least one coil of an electric line is arranged within the case, wherein the coil comprises an inductance, so that the magnetic field can induce an electric voltage in the coil during operation of the receiving device,
   the coil and its arrangement with in the case are adapted to receive the magnetic field from a receiving side,
   at least one capacitor is provided, which capacitor has a capacitance and is electrically connected to the coil or to at least one of the coils so as to form an electric circuit having a resonance frequency according to the inductance(s) of the coil(s) and to the capacitance(s) of the capacitor(s),
   the at least one capacitor is arranged on a side opposite to a receiving side, in the protruding portion of the case.

9. The method of claim 8, wherein the case has a flat configuration defining a first surface on the receiving side and a second surface on the side opposite to the receiving side, wherein the first surface and the second surface are connected by side surface areas of the case which are oriented for each side surface area to another side than the receiving side and the side opposite to the receiving side and which are smaller than the first surface and the second surface.

10. The method of claim 9, wherein the protruding portion of the case is located in a centre of the second surface.

11. The method of claim 10, wherein the protruding portion is elongated and extends along a centre line of the second surface.

12. The method of one of claim 8, wherein the protruding portion of the case is elongated and connecting electric lines which electrically connect —during operation of the receiving device —the at least one coil to another device are arranged within the protruding portion in addition to the at least one capacitor.

13. The method of one of claim 8, wherein a case is used which comprises a first part that forms a first surface on the receiving side and comprises a second part that forms a second surface on the side opposite to the receiving side, wherein the second part comprises the protruding portion of the case.

* * * * *

UNITED STATES PATENT AND TRADEMARK OFFICE
CERTIFICATE OF CORRECTION

Page 1 of 1

PATENT NO. : 9,806,540 B2
APPLICATION NO. : 14/782901
DATED : October 31, 2017
INVENTOR(S) : Dominik Anders et al.

It is certified that error appears in the above-identified patent and that said Letters Patent is hereby corrected as shown below:

In the Claims

Column 13, Line 37, Claim 1, after "to" insert -- a --

Column 14, Line 48, Claim 12, after "method of" delete "one of"

Column 14, Line 54, Claim 13, after "method of" delete "one of"

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*